(12) United States Patent
Meehan et al.

(10) Patent No.: US 9,683,281 B2
(45) Date of Patent: Jun. 20, 2017

(54) LASER ASSISTED OXIDE REMOVAL

(71) Applicant: United Technologies Corporation, Hartford, CT (US)

(72) Inventors: Robert J. Meehan, Manchester, CT (US); Neil B. Ridgeway, South Windsor, CT (US); Christopher J. Millea, Coventry, CT (US)

(73) Assignee: United Technologies Corporation, Farmington, CT (US)

(*) Notice: Subject to any disclaimer, the term of this patent is extended or adjusted under 35 U.S.C. 154(b) by 19 days.

(21) Appl. No.: 14/683,820

(22) Filed: Apr. 10, 2015

(65) Prior Publication Data
US 2016/0298222 A1 Oct. 13, 2016

(51) Int. Cl.
| | |
|---|---|
| *B05D 3/00* | (2006.01) |
| *C08J 7/18* | (2006.01) |
| *G21H 5/00* | (2006.01) |
| *C23C 4/02* | (2006.01) |
| *C23C 4/18* | (2006.01) |
| *C23C 14/08* | (2006.01) |
| *C23C 14/30* | (2006.01) |

(Continued)

(52) U.S. Cl.
CPC .............. *C23C 4/02* (2013.01); *B23K 26/082* (2015.10); *B23K 26/122* (2013.01); *B23K 26/123* (2013.01); *B23K 26/40* (2013.01); *C23C 4/073* (2016.01); *C23C 4/134* (2016.01); *C23C 4/18* (2013.01); *C23C 14/022* (2013.01); *C23C 14/083* (2013.01); *C23C 14/30* (2013.01); *C23C 14/325* (2013.01); *C23C 28/3215* (2013.01); *C23C 28/3455* (2013.01); *F01D 5/288* (2013.01); *B23K 2203/10* (2013.01); *F05D 2230/13* (2013.01); *F05D 2230/31* (2013.01); *F05D 2300/701* (2013.01)

(58) Field of Classification Search
CPC ... C23C 14/5806; C23C 14/5813; C23C 4/02; C23C 4/18; C23C 4/073
See application file for complete search history.

(56) References Cited

U.S. PATENT DOCUMENTS

| | | | |
|---|---|---|---|
| 5,645,893 A | 7/1997 | Rickerby et al. | |
| 5,759,640 A * | 6/1998 | Mannava | C23C 4/02 427/554 |

(Continued)

OTHER PUBLICATIONS

Matthew S. Brown and Craig B. Arnold, "Fundamentals of Laser-Material Interaction and Application to Multiscale Surface Modification", Laser Precision Microfabrication, Springer Series in Materials Science 135, 2010, pp. 91-120.

(Continued)

*Primary Examiner* — Michael Wieczorek
(74) *Attorney, Agent, or Firm* — Kinney & Lange, P.A.

(57) ABSTRACT

A method of forming a thermal barrier coating on a metal part includes laser cleaning a surface of the metal part to remove undesirable oxides and residues from the surface of the part. It further includes depositing an aluminum containing bondcoat on the part and thermally interdiffusing the bondcoat and the part with a heat treatment. Laser cleaning a surface of the bondcoat to remove oxides and debris from the surface forms an alpha aluminum oxide layer on the bondcoat. A ceramic topcoat is then deposited on the alpha aluminum oxide layer at a temperature above 1800° F. (982° C.).

8 Claims, 5 Drawing Sheets

(51) Int. Cl.
*C23C 28/00* (2006.01)
*C23C 4/073* (2016.01)
*B23K 26/082* (2014.01)
*C23C 4/134* (2016.01)
*B23K 26/122* (2014.01)
*B23K 26/12* (2014.01)
*B23K 26/40* (2014.01)
*C23C 14/02* (2006.01)
*C23C 14/32* (2006.01)
*F01D 5/28* (2006.01)
*B23K 103/10* (2006.01)

(56) References Cited

U.S. PATENT DOCUMENTS 6,607,611 B1 * 8/2003 Darolia ............... C23C 26/00
148/277
7,509,735 B2 * 3/2009 Philip ................ C23C 4/02
29/889.1
7,525,065 B2 4/2009 Engler et al.
2010/0326971 A1 12/2010 Helmick et al.
2013/0220982 A1 8/2013 Thomas et al.

OTHER PUBLICATIONS

C. Coddet et al., "Surface Preparation and Thermal Spray in a Single Step: The Protal Process-Example of Application for an Aluminum-Base Substrate," Journal of Thermal Spray Technology., vol. 8, No. 2, Jun. 1, 1999, pp. 235-242.
Dimitris K Christoulis et al., "Laser-Assisted Cold Spray (LACS)", C2P-Competence Center for Spray Processing 2National Research Council Canada—Industrial Materials Institute, Montreal, QC 3CLFA-Fraunhofer-ILT, Paris, Mar. 9, 2012, pp. 59-96.
Extended European Search Report for EP Application No. 16154795.5, dated Aug. 11, 2016, 11 pages.

* cited by examiner

LASER ASSISTED OXIDE REMOVAL

STATEMENT OF GOVERNMENT INTEREST

This invention was made with government support under Contract No. FA8650-11-C-5110 awarded by the U.S. Air Force. The government has certain rights in the invention.

BACKGROUND

The present invention relates generally to a thermal barrier coating system for a component that is exposed to high temperatures, such as a gas turbine engine component (e.g. blades, vanes, etc.). More particularly, the present invention relates to the formation of a thermal barrier coating system.

A gas turbine engine component ("component"), such as a blade tip, blade trailing edge, blade platform, blade airfoil, vane airfoil, vane trailing edge, or vane platform, is typically exposed to a high temperature and high stress environment. The high temperature environment may be especially problematic with a superalloy component. Namely, the high temperatures may cause the superalloy to oxidize, or weaken which then decreases the life of the component. In order to extend the life of the component, a thermal barrier coating system (TBC system) may be applied to the entire superalloy component or selective surfaces, such as surfaces of the superalloy component that are exposed to the high temperatures and other harsh operating conditions. A TBC system protects the underlying material (also generally called the "substrate") and helps inhibit oxidation, corrosion, erosion, and other environmental damage to the substrate. Desirable properties of a TBC system include low thermal conductivity and strong adherence to the underlying substrate.

The TBC system typically includes a metallic bondcoat or oxidation resistant coating and a ceramic topcoat (i.e., a thermal barrier coating or TBC topcoat). The bondcoat is applied to the substrate and aids the growth of a thermally grown oxide (TGO) layer, which is typically alpha aluminum oxide, ($Al_2O_3$ or "alumina"). Specifically, prior to or during deposition of the TBC topcoat on the bondcoat, the exposed surface of the bondcoat can be oxidized to form the alumina TGO layer or scale. The TGO forms a strong bond to both the topcoat and the bondcoat, and as a result, the TGO layer helps the TBC topcoat adhere to the bondcoat. The bond between the TGO and the topcoat is typically stronger than the bond that would form directly between the TBC topcoat and the bondcoat. The TGO also acts as an oxidation resistant layer, or an "oxidation barrier", to help protect the underlying substrate from damage due to oxidation.

The success of a TBC system depends on certain procedures used during deposition, including surface cleaning operations.

SUMMARY

A method of forming a thermal barrier coating on a metal part includes laser cleaning a surface of the metal part to remove undesirable oxides and residues from the surface of the part. It further includes depositing an aluminum containing bondcoat on the part and thermally interdiffusing the bondcoat and the part with a heat treatment. Laser cleaning a surface of the bondcoat to remove oxides and debris from the surface forms an alpha aluminum oxide layer on the bondcoat. A ceramic topcoat is then deposited on the alpha aluminum oxide layer at a temperature above 1800° F. (982° C.).

In an embodiment a method of removing a thermally grown oxide layer from an aluminum containing metal coating and forming an alpha aluminum oxide layer on the metal surface includes laser cleaning the metal surface.

In a further embodiment a laser based cleaning system for removing an oxide layer from an aluminum containing metal alloy surface includes a laser capable of removing the oxide layer and producing an alpha aluminum oxide layer on the metal surface. An optical system capable of focusing the laser at the oxide layer, and a scanning system capable of directing the focused laser beam over the metal surface to remove the oxide layer are included. Laser cleaning results in an alpha aluminum oxide layer on the aluminum containing metal surface.

DETAILED DESCRIPTION

Figure 1:
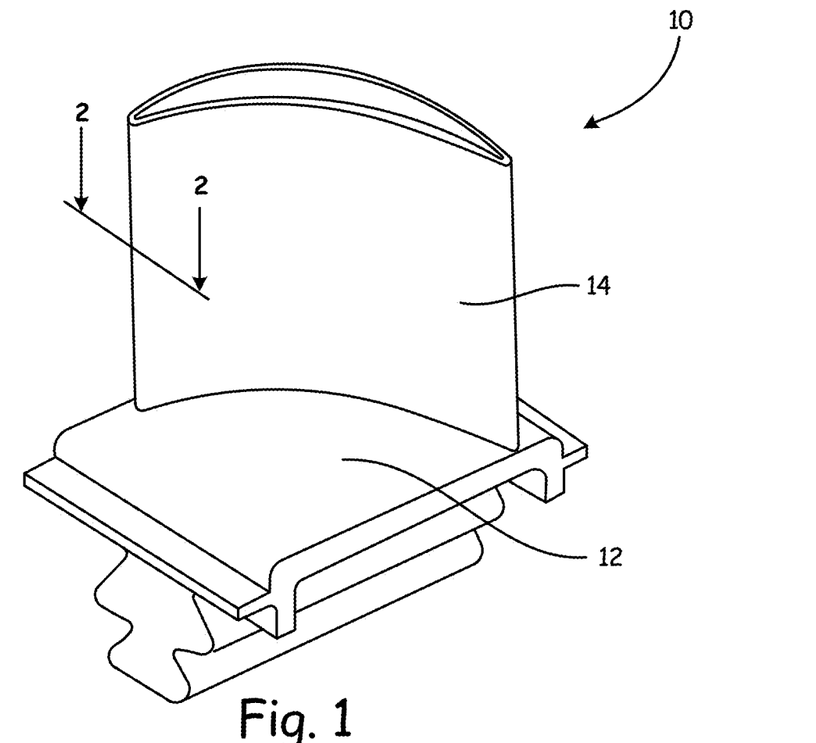
FIG. 1 is a perspective view of a turbine blade.

FIG. 1 is a perspective view of turbine blade 10 of a gas turbine engine. Turbine blade 10 includes platform 12 and airfoil 14. Airfoil 14 of turbine blade 10 may be formed of a nickel based, cobalt based, iron based superalloy, or mixtures thereof or a titanium alloy. Turbine blade 10 is exposed to high temperatures and high pressures during operation of the gas turbine engine. In order to extend the life of turbine blade 10 and protect it from high stress operating conditions and the potential for oxidation and corrosion, a thermal barrier coating (TBC) (shown in FIG. 2) is applied over airfoil 14 and platform 12 of turbine blade 10.

The exact placement of the TBC system depends on many factors, including the type of turbine blade 10 employed and the areas of turbine blade 10 exposed to the most stressful conditions. For example, in alternate embodiments, a TBC may be applied over a part of the outer surface of airfoil 14 rather than over the entire surface of airfoil 14. Airfoil 14 may include cooling holes leading from internal cooling passages to the outer surface of airfoil 14, and the system 16 may also be applied to the surface of the cooling holes.

Figure 2:
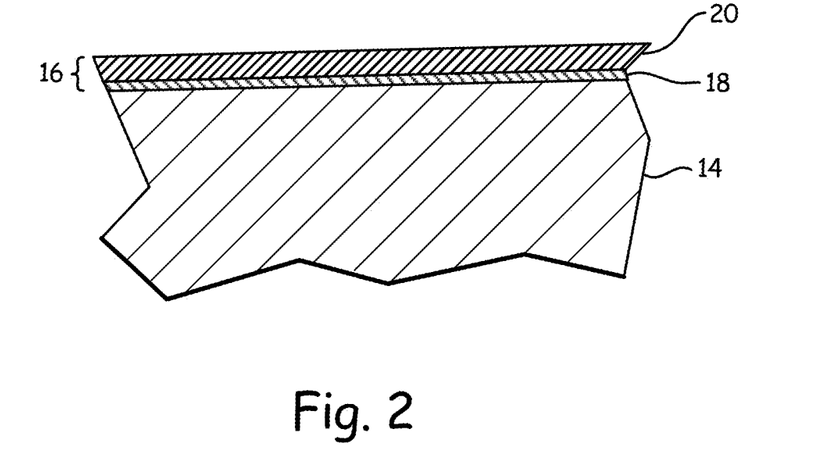
FIG. 2 is a cross-sectional view of the turbine blade of FIG. 1 where a section has been taken at line 2-2 (shown in FIG. 1) and show a TBC system overlying the airfoil of the turbine blade.

FIG. 2 is a sectional view of turbine blade 10, where a section is taken from line 2-2 in FIG. 1. TBC system 16 is applied to an exterior surface of airfoil 14 and platform 12.

TBC system 16 may include bondcoat 18 and ceramic layer 20. Bondcoat 18 overlays and bonds to airfoil 14 and platform 12 while ceramic layer 20 overlays and bonds to bondcoat 18. In the embodiment shown in FIG. 2, bondcoat 18 may be applied to airfoil 14 and platform 12 at a thickness ranging from about 0.5 mils (0.0127 mm) to about 10 mils (0.254 mm). Ceramic layer 20 may be any thermal barrier coating (or "topcoat") that is suitable for use on alumina forming bondcoats and/or alloys. Non-limiting examples include zirconia stabilized with yttria ($Y_2O_3$), gadolinia ($Gd_3O_3$), ceria ($CeO_2$), scandia ($Sc_2O_3$), and other oxides known in the art. Ceramic layer 20 may be applied by electron beam physical vapor deposition (EBPVD) or by plasma spray. Ceramic layer 20 may be deposited in thickness sufficient enough to provide the required thermal protection for bondcoat 18 and substrate 10.

Bondcoat 18 may be an MCrAlY coating where M may be Ni, Co, Fe, Pt, Ni-base alloy, Co-base alloy, Fe-base alloy or mixtures thereof. In an embodiment, M may include Hf or Si or mixtures thereof. Bondcoat 18 may be applied to airfoil 14 and platform 12 by any suitable technique including, but not limited to, thermal spray processes such as low pressure plasma spray (LPPS) deposition and high velocity oxyfuel (HVOF) deposition, physical vapor deposition such as cathodic arc deposition or chemical vapor deposition and others known in the art. In an embodiment, bondcoat 18 may be an aluminide bondcoat formed by prior art techniques such as pack cementation, chemical vapor deposition, and others followed by appropriate diffusion heat treatments.

Figure 3:
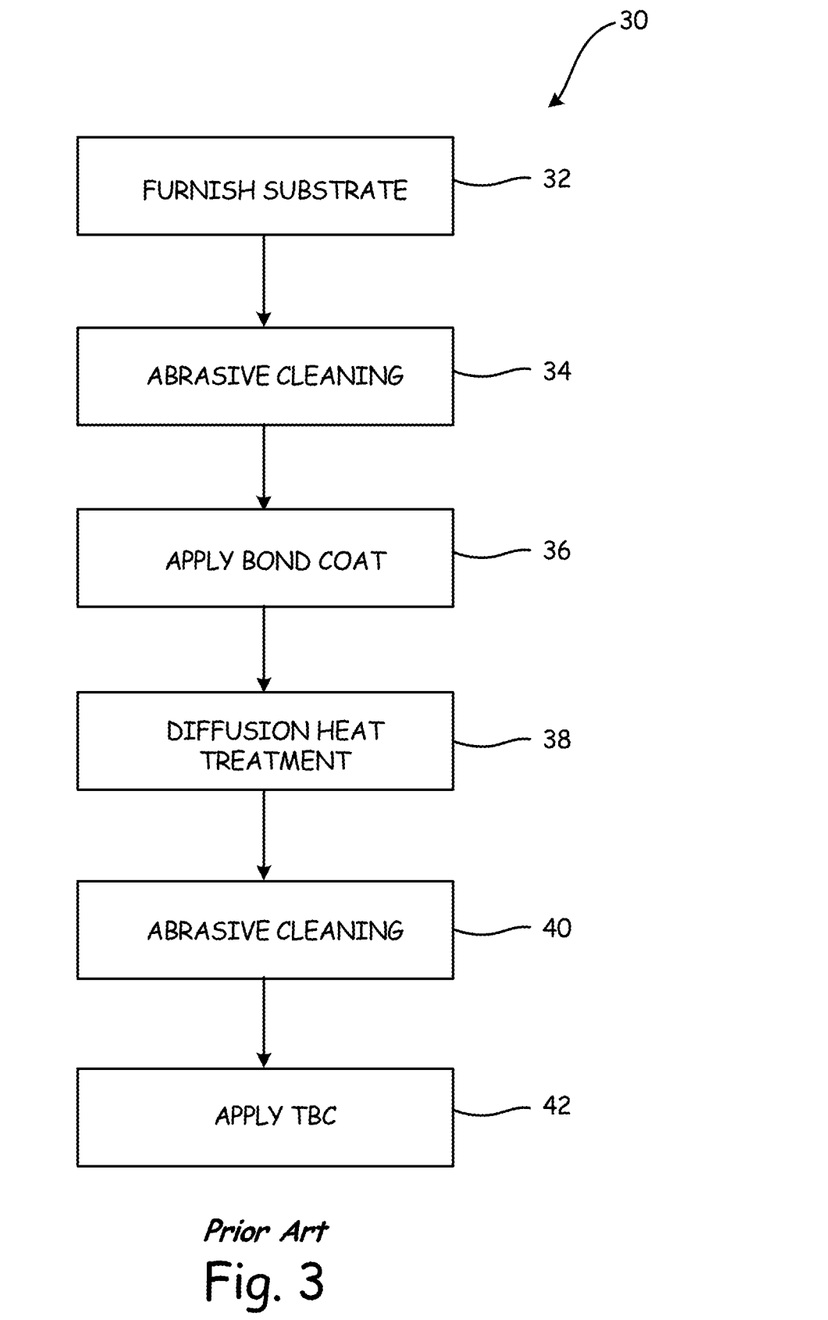
FIG. 3 is a prior art TBC application process.

The formation and retention of an alpha aluminum oxide scale on bondcoat 18 during and after deposition will ensure adhesion of topcoat ceramic layer 20 on bondcoat 18 in TBC system 16. Mixed oxide formation on bondcoat 18 during processing is detrimental to the performance of TBC system 16 and should be avoided. This is one of many reasons sequential cleaning steps are included in the formation of TBC system 16. A prior art TBC system 16 deposition process 30 is shown in FIG. 3. In process 30, turbine airfoil substrates, which may be nickel based superalloy airfoils such as a turbine blade or vane, are furnished (step 32). The first step in the process is to prepare substrate 14 for deposition by cleaning the substrate surface. In prior art process 30, a preferred cleaning technique may be abrasive cleaning (step 34). The preferred abrasive cleaning process may be a grit blast process using, for example, aluminum oxide abrasive. The purpose of the cleaning step is to produce a substrate surface free from surface oxides and other contaminants in preparation for deposition of a bondcoat.

In the next step, bondcoat 18 is deposited (step 36). A preferred deposition method in the prior art process 30 may be a low pressure plasma spray (LPPS). A preferred bondcoat may be NiCrAlY.

In the next step, substrates 12 and 14 may be subjected to a vacuum diffusion heat treat at about 1975° F. (1079° C.) for about 4 hours to interdiffuse bondcoat 18 and substrates 12 and 14 (step 38). During this process aluminum oxide and other mixed oxides form on bondcoat 18. The presence of mixed oxides may degrade the adhesion of a topcoat on bondcoat 18, and such mixed oxides are preferably removed. In some embodiments, bondcoat 18 may be subjected to a light peening process to further prepare the surface for eventual ceramic topcoat deposition.

In order to remove the mixed oxides that formed during the diffusion heat treat step, bondcoated substrates 12 and 14 are preferably subjected to another abrasive cleaning (step 40). It is presumed, after this step, that the bondcoat surface is oxide free.

In the final step, ceramic topcoat 20 is deposited on bondcoat 18 (step 42). In prior art process 30, ceramic topcoat 20 comprises zirconia ($ZrO_2$) containing up to 10 weight percent yttria ($Y_2O_3$). Deposition may be accomplished by electron beam physical vapor deposition (EBPVD) with the substrate at about 1800° F. (982° C.). The resulting microstructure of the thermal barrier coating comprises vertical columns separated by vertical cracks imparting increased compliance and resulting structural stability during cyclic thermal loading during operation.

In prior art process 30, a major reason for the abrasive cleaning steps is to remove all mixed oxides present on substrates 12 and 14 before deposition of bondcoat 18 and on bondcoat 18 after the diffusion heat treatment. Grit blast cleaning may leave particles embedded in the substrates as well as residues of metal and ceramic dust, and abrasive particles that must be subsequently removed before continuing to the next steps in a TBC system formation process. The process disclosed herein (described below with respect to FIG. 4) eliminates these steps by replacing the abrasive cleaning process with a laser ablating process to both clean the surface and remove unwanted mixed oxides and other debris on the original substrate and on the bondcoat. A major feature of the laser ablation cleaning process is that the cleaned surfaces are free of any debris that, in other circumstances, may need other cleaning steps to remove, with economic and logistical benefits. As discussed later there are indications that the laser cleaning process may result in the formation of a beneficial alpha aluminum oxide layer during cleaning.

Figure 4:
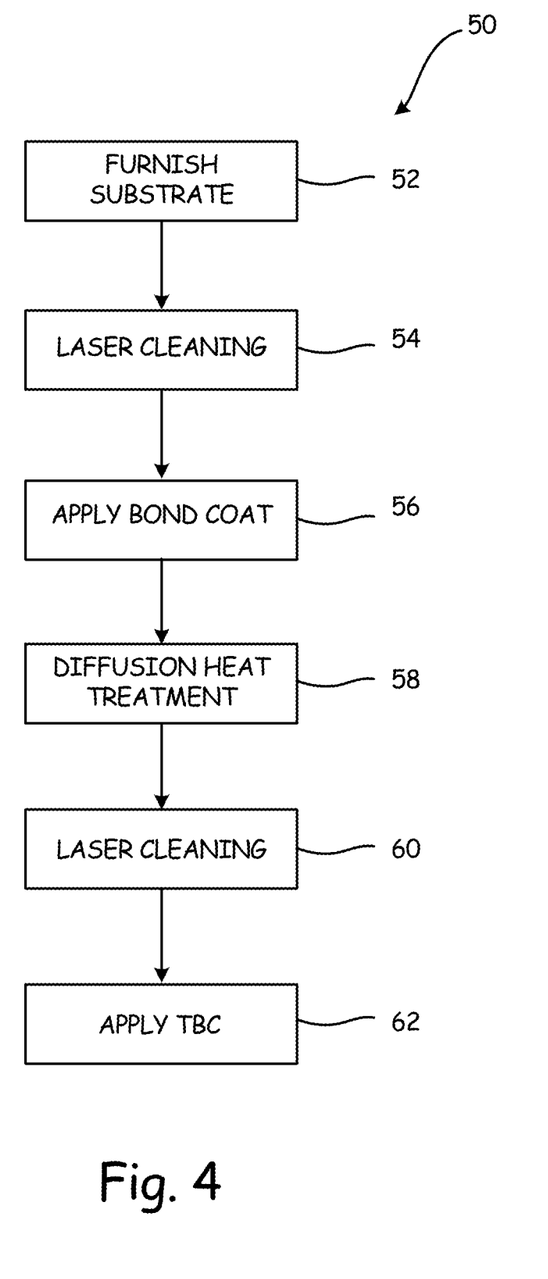
FIG. 4 is a TBC application process of the invention.

TBC system deposition process 50 is shown in the flow diagram of FIG. 4. In process 50, a part such as an exemplary turbine blade, or vane, forms substrates 12 and 14 and is furnished for coating (step 52). In the first step, the surface of substrates 12 and 14 are cleaned by the process of laser cleaning (step 54). During this process, substrates 12 and 14 are exposed to a laser system that provides a laser beam focused at the surface to remove any oxide or other debris on the surface. The laser and a substrate positioning apparatus allows the focused laser beam to scan the surface in increments until the entire surface is scanned. An optical system may be attached to the laser to control beam shape, size and focus suitable for removing oxide layers, impurities and other unwanted surface features. The lasers may be YAG (yttrium aluminum garnet), UV (ultraviolet), eximer, $CO_2$ (carbon dioxide), fiber, disc laser, or others known in the art. The lasers may be pulsed or continuous wave (CW). A preferred laser may be a pulsed YAG laser operating at laser powers typically up to 100 watts. The laser may be focused to remove preselected depths of material such as mixed oxides and oxide scales. The surface environment during laser cleaning may be ambient atmosphere, inert (e.g. Argon) atmosphere, water, or mixtures thereof. Without being bound by any particular theory, it is suggested that a mechanism of material removal by laser cleaning may be vaporization or thermal shock. Advantageously there may be no surface debris following laser ablation cleaning.

Following laser cleaning, bondcoat 18 is deposited on substrates 12 and 14 (step 56). An example deposition method is by low pressure plasma spray (LPPS). An example bondcoat is NiCrAlY.

Figure 5:
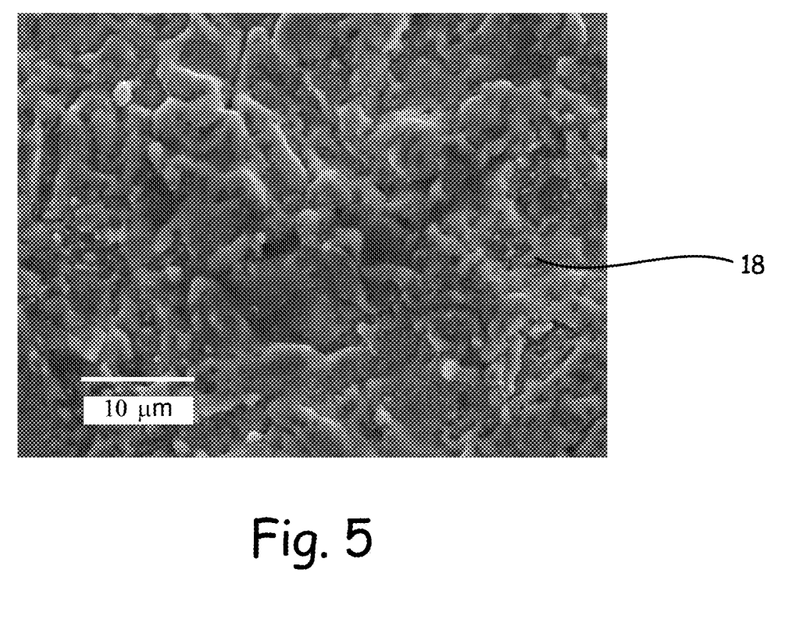
FIG. 5 is a scanning electron micrograph of the surface of a plasma sprayed bondcoat after laser cleaning.

Substrates 12 and 14 including bondcoat 18 are then subjected to a vacuum diffusion heat treatment at about 1975° F. (1079° C.) for about 4 hours to interdiffuse bondcoat 18 and substrates 12 and 14 (step 58). During this process aluminum oxide and other metal oxides form on bondcoat 18. The mixed oxides may interfere with the interfacial integrity and degrade the adhesion of topcoat 20 to be deposited on bondcoat 18, and need to be removed. Mixed oxides and other unwanted surface features are removed by the laser ablation cleaning process (step 60). FIG. 5 shows a 1000× scanning electron micrograph of the surface of a plasma sprayed NiCrAlY bondcoat 18 following laser ablation cleaning. No discernible residue is apparent in the micrograph. In this case the surface was laser cleaned in an ambient atmosphere.

Topcoat 20 may be applied to bondcoat 18 by electron beam physical vapor deposition (EBPVD) (step 62). An example TBC topcoat is zirconia containing up to 10 weight percent yttria deposited at a substrate temperature of about 1800° F. (982° C.). During EBPVD deposition of topcoat 20, the substrate is preheated up to about 2000° F. (1093° C.). Deposition of yttria stabilized zirconia topcoat is then carried out at about 1800° F. (982° C.). During the preheat, mixed oxides other than alpha alumina may form on a clean bondcoat surface at temperatures between about 700° F. (371° C.) and 1800° F. (982° C.) depending on the dwell time in this temperature range. Examples may include eta and theta polymorphs of aluminum oxide as well as other oxides in the form of loosely bonded, discontinuous phases that may interfere with the ability of the ceramic topcoat to adhere to the underlying bondcoat. At temperatures above 1800° F. (982° C.) alpha alumina forms as a continuous, thin, adherent layer and presumably blocks the formation of other oxides. The presence of an alpha alumina scale on a bondcoat is responsible for strong adhesion between the topcoat and the bondcoat during engine operation.

Figure 6:
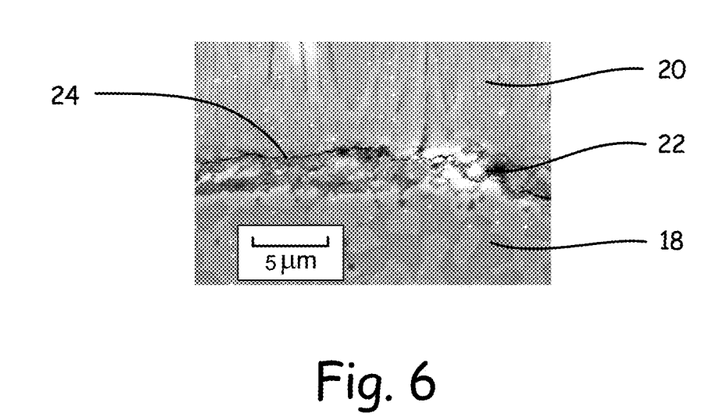
FIG. 6 is a scanning electron micrograph of a cross section of a thermal barrier coating on a bondcoat with a mixed oxide interfacial layer.
Figure 7:
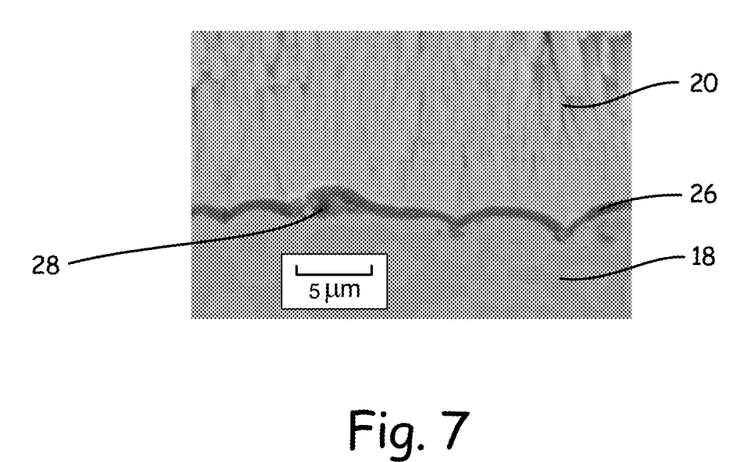
FIG. 7 is a scanning electron micrograph of a cross section of a thermal barrier coating on a laser cleaned bondcoat.

As mentioned, a major reason for abrasive cleaning the surface of bondcoat 18 following a diffusion heat treatment in prior art process 30 is to remove all thermally grown mixed oxides that form during the heat treatment. Proper process control during a preheat to 1900° F. (1038° C.) in an EBPVD reactor prior to deposition of ceramic topcoat 20 minimizes thermally grown mixed oxide formation. In the event that thermally grown mixed oxides do form, adhesion of topcoat 20 to bondcoat 18 is compromised. An example of this occasional unwanted occurrence is shown FIG. 6. FIG. 6 shows a thermally grown mixed oxide layer that formed between an EBVPD yttria stabilized zirconia ceramic topcoat on an abrasively cleaned low pressure plasma sprayed NiCrAlY bondcoat. FIG. 6 is a scanning electron micrograph of a cross section of EBPVD ceramic topcoat 20 on bondcoat 18. The microstructure of ceramic topcoat 20 exhibits the characteristic mechanically compliant microstructure of columnar grains separated by vertical microcracks typical of TBC structures. In this example, the interface consists of a thermally grown mixed oxide layer 22 and visible delaminations 24 all contributing to eventual topcoat spallation and TBC coating failure. The occasional, unfortunate appearance of thermally grown mixed oxide layers in TBC structures is an issue that may be addressed by the present invention.

In a series of thermal barrier coatings produced according to laser based cleaning process 50 shown in FIG. 4, large scale thermally grown mixed oxide interfacial layers 22 as shown in FIG. 5 have never been observed. An example is shown in FIG. 6. FIG. 6 is a scanning electron micrograph of a cross section of EBPVD yttria stabilized zirconia topcoat 20 on laser cleaned low pressure plasma sprayed NiCrAlY bondcoat 18. The microstructure of ceramic topcoat 20 exhibits the characteristic mechanically compliant microstructure of columnar grains separated by vertical microcracks typical of TBC structures. In this example, the thin dark continuous line 26 is alpha aluminum oxide and the excellent adhesion is evident. Light region 28 appears to be a small region of thermally grown mixed oxide. All the laser cleaned TBC samples of the present invention exhibited the same interfacial integrity. Without being bound by any particular theory, it is suggested that the surface conditions existing during laser cleaning enhance the formation of alpha aluminum oxide during the cleaning process. Presence of alpha aluminum oxide prevents the formation of mixed oxides during the preheat to 2000° F. (1093° C.) in the EBPVD coater and results in continuous thermally grown alpha aluminum oxide scale 26 on bondcoat 18 during deposition of ceramic topcoat 20. Presumably, at least 99 percent of the laser cleaned area of bondcoat 18 is covered by an alpha aluminum oxide layer following laser cleaning.

Discussion of Possible Embodiments

The following are non-exclusive descriptions of possible embodiments of the present invention.

A method of forming a thermal barrier coating on a metal part may include: laser cleaning a surface of the metal part to remove undesirable oxides and residues from the surface of the part; depositing an aluminum containing bondcoat on the part; thermally interdiffusing the aluminum containing bondcoat and the part with a heat treatment; laser cleaning a surface of the aluminum containing bondcoat to remove oxides and debris from the surface of the bondcoat and form an alpha aluminum oxide layer on the bondcoat; preheating the surface of the aluminum containing bondcoat above 1800° F. (982° C.); and depositing a ceramic topcoat on the alpha aluminum oxide layer on the bondcoat.

The method of the preceding paragraph can optionally include, additionally and/or alternatively any, one or more of the following features, configurations and/or additional components:

The metal part may be a nickel-based, cobalt-based, iron-based superalloy or mixtures thereof.

The laser cleaning may include exposing the surface to a laser focused on the surface of the metal part or on the surface of the aluminum containing bondcoat.

The laser may be a YAG (yttrium aluminum garnet), UV (ultraviolet), eximer, $CO_2$ (carbon dioxide), fiber, or disc laser.

The aluminum containing bondcoat may be MCrAlY wherein M is Ni, Co, Fe, Pt, Hf, Si, Fe-base, Ni-base, or Co-base alloys, or mixtures thereof.

Depositing the aluminum containing bondcoat may include low pressure plasma spray (LPPS), high velocity oxy fuel (HVOF) spray, cathodic arc deposition, or chemical vapor deposition.

The ceramic topcoat may be yttria stabilized zirconia, gadolinia zirconia, ceria stabilized zirconia, or mixtures thereof.

Depositing the ceramic topcoat may include electron beam physical vapor deposition (EBPVD).

A method of removing a thermally grown oxide layer from an aluminum containing metal coating and forming an alpha aluminum oxide layer on the metal surface may include laser cleaning the metal surface.

The method of the preceding paragraph can optionally include, additionally and/or alternatively any, one or more of the following features, configurations and/or additional components:

The aluminum containing metal coating may be MCrAlY wherein M is Ni, Co, Fe, Pt, Hf, Si, Fe-base, Ni-base, or Co-base alloys or mixtures thereof.

The coating may be formed by low pressure plasma spray (LPPS), high velocity oxy fuel (HVOF) spray, cathodic arc deposition, or chemical vapor deposition.

The coating may be formed by low pressure plasma spray (LPPS).

The laser may be focused at the oxide layer.

The laser may be a YAG (yttrium aluminum garnet), UV (ultraviolet), eximer, or $CO_2$ (carbon dioxide), fiber, or disc laser.

The laser may be a YAG (yttrium aluminum garnet) laser wherein a power of the laser may be up to about 100 watts.

The surface environment during laser cleaning may be air, inert gas, water, or combinations thereof.

The temperature during cleaning may be room temperature.

A laser based cleaning system for removing an oxide layer from an aluminum containing metal surface may include: a laser capable of removing the oxide layer and producing an alpha aluminum oxide layer on the metal surface; an optical system capable of focusing the laser at the oxide layer; and a scanning system capable of directing the focused laser beam over the metal surface to remove the oxide layer and produce the alpha aluminum oxide layer on the aluminum containing metal surface.

The laser based cleaning system of the preceding paragraph can optionally include, additionally and/or alternatively any, one or more of the following features, configurations and/or additional components:

The coating may be an alloy coating comprising MCrAlY, wherein M is Ni, Co, Fe, Pt, Hf, Si, Fe-base, Ni-base, or Co-base alloys or mixtures thereof.

The alpha aluminum oxide layer may cover over 99 percent of the surface exposed to the laser.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of forming a thermal barrier coating on a metal part comprising:
   laser cleaning a surface of the metal part to remove undesirable oxides and residues from the surface of the part;
   depositing an aluminum containing bondcoat on the part;
   thermally interdiffusing the aluminum containing bondcoat and the part with a heat treatment;
   laser cleaning a surface of the aluminum containing bondcoat to remove oxides and debris from the surface of the bondcoat and form an alpha aluminum oxide layer on the bondcoat;
   preheating the surface of the aluminum containing bondcoat above 1800° F. (982° C.); and
   depositing a ceramic topcoat on the alpha aluminum oxide layer on the bondcoat.

2. The method of claim 1 wherein the metal part comprises a nickel based, cobalt based, iron based superalloy or mixtures thereof.

3. The method of claim 1 wherein laser cleaning comprises exposing the surface to a laser focused on the surface of the metal part or on the surface of the aluminum containing bondcoat.

4. The method of claim 3 wherein the laser comprises a YAG (yttrium aluminum garnet), UV (ultraviolet), eximer, $CO_2$ (carbon dioxide), fiber, or disc laser.

5. The method of claim 1 wherien the aluminum containing bondcoat comprises MCrAlY wherein M is Ni, Co, Fe, Pt, Hf, Si, Fe-base, Ni-base, or Co-base alloys, or mixtures thereof.

6. The method of claim 1 wherein depositing the aluminum containing bondcoat comprises low pressure plasma spray (LPPS), high velocity oxy fuel (HVOF) spray, cathodic arc deposition, or chemical vapor deposition.

7. The method of claim 6 wherein depositing the ceramic topcoat comprises electron beam physical vapor deposition (EBPVD).

8. The method of claim 1 wherein the ceramic topcoat comprises yttria stabilized zirconia, gadolinia zirconia, ceria stabilized zirconia, or mixtures thereof.

* * * * *